United States Patent
Escamilla et al.

(10) Patent No.: US 12,267,979 B2
(45) Date of Patent: Apr. 1, 2025

(54) SYSTEM AND METHOD FOR MANAGING POSITIONING AND ACCESS FOR DATA PROCESSING SYSTEMS

(71) Applicant: Dell Products L.P., Round Rock, TX (US)

(72) Inventors: Eduardo Escamilla, Round Rock, TX (US); Robert G. Bassman, Dalton, MA (US); Gilberto Hernandez, Pharr, TX (US)

(73) Assignee: Dell Products L.P., Round Rock, TX (US)

( * ) Notice: Subject to any disclaimer, the term of this patent is extended or adjusted under 35 U.S.C. 154(b) by 266 days.

(21) Appl. No.: 18/159,919

(22) Filed: Jan. 26, 2023

(65) Prior Publication Data
US 2024/0260220 A1    Aug. 1, 2024

(51) Int. Cl.
H05K 7/14    (2006.01)

(52) U.S. Cl.
CPC ....... *H05K 7/14325* (2022.08); *H05K 7/1435* (2013.01)

(58) Field of Classification Search
CPC . G06F 1/187; G06F 1/16; G06F 1/185; G06F 1/181; G06F 1/188; G06F 13/409; G06F 1/186; H05K 7/1487; H05K 5/0221; H05K 5/0226; H05K 7/18; H05K 5/023; H05K 5/0256; H05K 7/1411; H05K 7/1418; H05K 7/1421; H05K 7/14325; H05K 7/1445; H05K 7/1488; H05K 7/1489; H05K 7/183
USPC .. 361/622, 727, 679.33, 679.4, 679.37, 796, 361/608; 312/223.2
See application file for complete search history.

(56) References Cited

U.S. PATENT DOCUMENTS

| | | | |
|---|---|---|---|
| 7,308,705 B2 | 12/2007 | Gordy et al. | |
| 7,800,897 B2* | 9/2010 | Hung | G06F 1/1632 |
| | | | 361/679.41 |
| 7,970,279 B2 | 6/2011 | Dress | |
| 9,152,182 B1* | 10/2015 | McMahon | G06F 1/185 |
| 9,331,899 B2 | 5/2016 | Christopher et al. | |
| 9,582,057 B2* | 2/2017 | Hartman | H05K 7/1487 |
| 9,668,381 B2* | 5/2017 | Cho | H05K 7/20727 |
| 9,684,575 B2 | 6/2017 | Breakstone et al. | |
| 10,019,388 B2 | 7/2018 | Long et al. | |

(Continued)

FOREIGN PATENT DOCUMENTS

CN    117435002 A  *  1/2024

OTHER PUBLICATIONS

"DC-MHS R1 Overview," 2022 OCP Global Summit (56 Pages).

(Continued)

*Primary Examiner* — Mandeep S Buttar
(74) *Attorney, Agent, or Firm* — WOMBLE BOND DICKINSON (US) LLP

(57) ABSTRACT

Methods and systems for managing the operation of data processing systems are disclosed. A data processing system may include a computing device that may provide computer implemented services. To provide the computer implemented services, data processing system may include hardware components. The hardware components may be positioned with an enclosure. A multifunctional handle may be used to facilitate both repositioning of the data processing system and securing of the hardware components with the enclosure.

20 Claims, 5 Drawing Sheets

(56) References Cited

U.S. PATENT DOCUMENTS

| | | | |
|---|---|---|---|
| 10,261,561 B2 | 4/2019 | Chuang et al. | |
| 10,733,116 B2 | 8/2020 | Litichever et al. | |
| 11,029,742 B2 | 6/2021 | Webel et al. | |
| 11,112,846 B2 | 9/2021 | Strach et al. | |
| 2006/0061955 A1* | 3/2006 | Imblum | G11B 25/043 |
| 2008/0126629 A1 | 5/2008 | Huang | |
| 2009/0135558 A1* | 5/2009 | Hughes | H05K 7/20727 |
| | | | 361/679.46 |
| 2009/0300329 A1 | 12/2009 | Naffziger et al. | |
| 2014/0168891 A1* | 6/2014 | Mundt | G06F 1/188 |
| | | | 361/679.02 |
| 2014/0204537 A1* | 7/2014 | Rust | H05K 7/02 |
| | | | 361/727 |
| 2016/0205804 A1* | 7/2016 | Hartman | H05K 7/1487 |
| | | | 361/679.02 |
| 2016/0234962 A1* | 8/2016 | Shinsato | G11B 33/128 |
| 2017/0147052 A1 | 5/2017 | Waters et al. | |
| 2022/0130432 A1 | 4/2022 | Jayapal et al. | |

OTHER PUBLICATIONS

Kennedy, Jeff et al., "Peripheral Sideband Tunneling Interface (M-PESTI)," Datacenter—Modular Hardware Systems (DC-MHS) Rev 1.0, Apr. 27, 2022 (50 Pages).

"Why won't the computer wake up when connected over USB," Belkin Official Support, Web Page <https://www.belkin.com/support-article/?articleNum=8130>, accessed on Oct. 17, 2022 (2 Pages).

"Clock Gating for Power Reduction," CoQube Analytics and Services, 2021, Web Page <https://coqube.com/clock-gating-for-power-reduction/>, accessed on Oct. 17, 2022 (12 Pages).

Kennedy, Patrick, "Liquid Cooling Next-Gen Servers Getting Hands-on with 3 Options," ServeTheHome, Aug. 2, 2021, Web Page <https://www.servethehome.com/liquid-cooling-next-gen-servers-getting-hands-on-3-options-supermicro/4/>, accessed on Oct. 17, 2022 (10 Pages).

\* cited by examiner

SYSTEM AND METHOD FOR MANAGING POSITIONING AND ACCESS FOR DATA PROCESSING SYSTEMS

FIELD OF THE EMBODIMENTS

Embodiments disclosed herein relate generally to thermal management of devices. More particularly, embodiments disclosed herein relate to systems and methods for providing for flexibility in powering cooling devices.

BACKGROUND

Computing devices may store data and used stored data. For example, computing devices may utilize data when providing computer implemented services. If computing devices are unable to access data, process data, and/or perform other functions, then the computing devices may be unable to provide some, or all, of the computer implemented services desired by users of the computing devices.

BRIEF DESCRIPTION OF THE DRAWINGS

Embodiments are illustrated by way of example and not limitation in the figures of the accompanying drawings in which like references indicate similar elements.

DETAILED DESCRIPTION

Figure 1A:
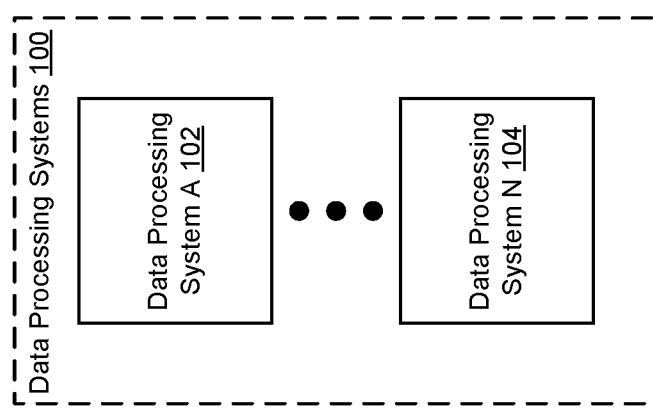
FIG. 1A shows a block diagram illustrating a system in accordance with an embodiment.

Various embodiments will be described with reference to details discussed below, and the accompanying drawings will illustrate the various embodiments. The following description and drawings are illustrative and are not to be construed as limiting. Numerous specific details are described to provide a thorough understanding of various embodiments. However, in certain instances, well-known or conventional details are not described in order to provide a concise discussion of embodiments disclosed herein.

Reference in the specification to "one embodiment" or "an embodiment" means that a particular feature, structure, or characteristic described in conjunction with the embodiment can be included in at least one embodiment. The appearances of the phrases "in one embodiment" and "an embodiment" in various places in the specification do not necessarily all refer to the same embodiment.

References in the specification to "adapted to" may, in the context of a programmable device, indicate that the programmable device has been programmed to perform the functionality described with respect to the programmable device. In the context of a static device, "adapted to" may indicate that the device include circuitry to perform the functionality described with respect to the static device.

In general, embodiments disclosed herein relate to methods and systems for providing computer implemented services using data processing systems. To provide the computer implemented services, the data processing system may include hardware components. The hardware components may be positioned in an enclosure.

To manage the enclosure, a handle may be attached to the enclosure. The handle may be used to reposition the enclosure.

The handle may be attached to internal sidewalls of power supply bays that are attached to the enclosure. Consequently, when force is applied to the handle, the force may be transmitted to the enclosure thereby causing it, and the hardware components positioned in it to move.

The handle may be positioned on an end of the enclosure. The end of the enclosure may be substantially reserved for various functionalities. Extensions from the sidewalls of the power supply may extend out of the rear of the enclosure thereby facilitating attachment of the handle without using the limited area of the end of the enclosure.

To assist in securing hardware components with the enclosure, various fixation elements may be attached to the handle. The fixation elements may allow hardware components positioned in the enclosure to be secured to the enclosure via the handle and the sidewalls of the power supply bays. By doing so, the area of the end of the enclosure may be reserved for other functions (e.g., other than mechanical securing, such as routing cables, exchanging gasses with an ambient environment, etc.).

Thus, a data processing system in accordance with an embodiment may have improved functionalities. For example, the data processing systems may have improved communication bandwidth, improved compute speed, etc. Accordingly, in addition to other technical problems, embodiments disclosed herein may address the technical problem of limited physical space in computing environments. The disclosed embodiments may do so by include a multifunctional handle that facilitates securing of other hardware components while also facilitating repositioning of data processing systems.

In an embodiment, a data processing system that provides computer implemented services is provided. The data processing system may include hardware components that provide the computer implemented services; an enclosure that houses the hardware components, the enclosure comprising: a bay positioned between a first power supply bay and a second power supply bay; the first power supply bay comprising a first sidewall delineating the first power supply bay from the bay; a second power supply bay comprising a second sidewall delineating the second power supply bay from the bay; a first extension connected to the first sidewall and extending outward a first distance from a rear of the enclosure; a second extension connected to the second sidewall and extending outward the first distance from the rear of the enclosure; and a handle attached to the first extension and the second extension.

The first sidewall may include a metal plate that extends inward a second distance from a rear of the enclosure.

The metal plate may extend away from a bottom of the enclosure by a third distances defining a top edge of the metal plate.

The first extension may be connected proximate to the top edge of the metal plate at the rear of the enclosure.

The bay may extend away from the bottom of the enclosure by the third distances defining a top of the bay, and a top of the first power supply bay is aligned with a top of the bay.

The handle may include a flat member (e.g., a bar, plate, etc.) having a thickness, and the thickness lies substantially in a plane aligned with the top of the bay.

The handle may include an attachment feature (e.g., a threaded hole) that extends through a majority of the thickness, the attachment feature facilitating reversible attachment of a fixation element to the handle.

The data processing system may also include a riser positioned above the bay; and the fixation element to secure a portion of the riser that is proximate to the rear of the enclosure.

The fixation element may include a bracket adapted to, when secured to the handle, position a plate in a plane aligned with the rear of the enclosure.

The plate in the plane aligned with the rear of the enclosure may include an attachment feature adapted to reversibly attach to the portion of the riser.

While the attachment feature is attached to the portion of the riser, the portion of the riser may be fixedly held in place, and force applied to the riser may be transmitted to the enclosure through the handle, the first extension, and the first sidewall.

The data processing system may also include a network interface component positioned in the bay, the network interface component comprising a connector that extends outward a second distance from the rear of the enclosure.

The first extension may be positioned proximate to a top of the bay, and the handle may be positioned above the network interface component while the handle is attached to the first extension.

The data processing system may also include a power supply positioned in the first power supply bay, the power supply comprising a power supply handle extending a second distance outward from the rear of the enclosure.

The power supply handle may not transmit first force applied to the power supply handle to the enclosure, and the handle transmits second force applied to the handle to the enclosure through the first extension and the first sidewall.

In an embodiment, an enclosure is provided. The enclosure may include a payload area for the hardware components of the data processing system, the bay, the power supply bays, the extensions, and the handle, as discussed above.

Turning to FIG. 1A, a block diagram illustrating a system in accordance with an embodiment is shown. The system shown in FIG. 1A may provide any quantity and type of computer implemented services. To provide the computer implemented services, the system of FIG. 1A may include data processing systems 100.

All, or a portion, of data processing systems 102-104 may provide computer implemented services to users and/or other computing devices operably connected to data processing systems 100. The computer implemented services may include any type and quantity of services including, for example, database services, instant messaging services, video conferencing services, etc. Data processing systems 100 may provide other types of computer implemented services without departing from embodiments disclosed herein. Data processing systems 100 may each provide similar and/or different computer implemented services, and any of data processing systems 100 may provide any of the computer implemented services in cooperation with other data processing systems and/or independently.

To provide computer implemented services, data processing systems 100 may need to operate in a predetermined manner. The predetermined manner of operation may include, for example, executing an operating system, drivers, and/or other type of management entities that mediate, facilitate, or otherwise operate in a manner which enables the applications to operate (e.g., by providing abstracted access to hardware resources used in the execution of the applications).

To operate in the predetermined manner, data processing systems 100 may perform one or more operations to enter the predetermined manner of operation (by changing from other manners of operation to the predetermined manner of operation). These operations may include, for example, a boot process from a power-on (or reset or other manner of operation that differs from the predetermined manner of operation to the extent that the applications may not be able to operate) to hand off operation management of the data processing system to an operating system or other type of operational management entity that places data processing systems 100 into the predetermined manner of operation. The operating system may, for example, provide abstracted access to resources (e.g., processing resources provided by processors, memory resource provided by memory modules, storage resources provided by storage devices, etc.) utilized by the applications hosted by the data processing system.

For example, consider a scenario where a data processing system has been shut off. After the data processing system is turned on, the data processing system may be operating in a startup manner such that the data processing system is not yet able to support execution of an application (e.g., the application may not be able to successfully execute until the data processing system hosts an operating system or other type of management entity). To enter the predetermine manner of operation conducive to execution of the application, the data processing system may go through a boot process (e.g., a startup) which may be performed by one or more types of management entity such as a basic input-output system and/or other startup management entities. The management entity may perform any number of actions (e.g., a "startup process") to prepare the data processing system to begin execution of an operating system and/or other type of management entity that facilitates execution of applications.

To perform the startup process and provide the computer implemented services, data processing systems 100 may include various hardware components (e.g., integrated circuit-based devices). The hardware components may perform various types of functionalities such as data processing functionality, communication functionality, etc.

When providing their functionalities, any of the hardware components may consume electricity and generate heat. Any of the hardware components may have limitations on their operation. For example, any of the hardware components may have limitations regarding their temperatures (e.g., hardware components having such limitations being referred to as "temperature sensitive hardware components"). The temperature limitations may include an upper temperature limit. If temperatures of the temperature sensitive hardware components fall outside of the upper limit, then the corresponding temperature sensitive hardware components may be impaired (e.g., may not operate, may operate but in an undesirable manner such as including errors in their operation, may be subject to damage if operated, etc.).

To manage heat and supply the hardware components with power, the hardware components may be positioned in a computing environment, such as a data center or other facility. The computing environment may include structures (e.g., racks) for positioning and orienting collections of hardware components. Consequently, larger numbers of hardware components may be packed into the computing environments thereby improving the availability of computing resources for providing computer implemented services.

In general, embodiments disclosed herein relate to systems, devices, and methods for positioning, orienting, and/or otherwise managing collections of hardware components in computing environments. To manage the collections of the hardware components, the hardware components may be positioned in enclosures that may be compatible with structures used to position and/or orient the hardware components positioned in the enclosures.

The enclosures may include handles usable to physically manipulate the enclosures within a space. For example, the handle may be positioned on one end of the enclosure. The handle may allow a person (e.g., a technician) to efficiently apply forces to the enclosure to move and rotate the enclosure. Thus, the handle may be used, for example, to insert or remove the enclosure from a rack or other structure.

To improve the quality of computer implemented services provided by the hardware components, a majority of front or rear surfaces of the enclosure may reserved for use by the hardware components. For example, interconnections, airflow ports, and/or other structures usable to manage the operation of the hardware components may take up a majority of the surface of the rear and front of the enclosure.

Figure 1B:
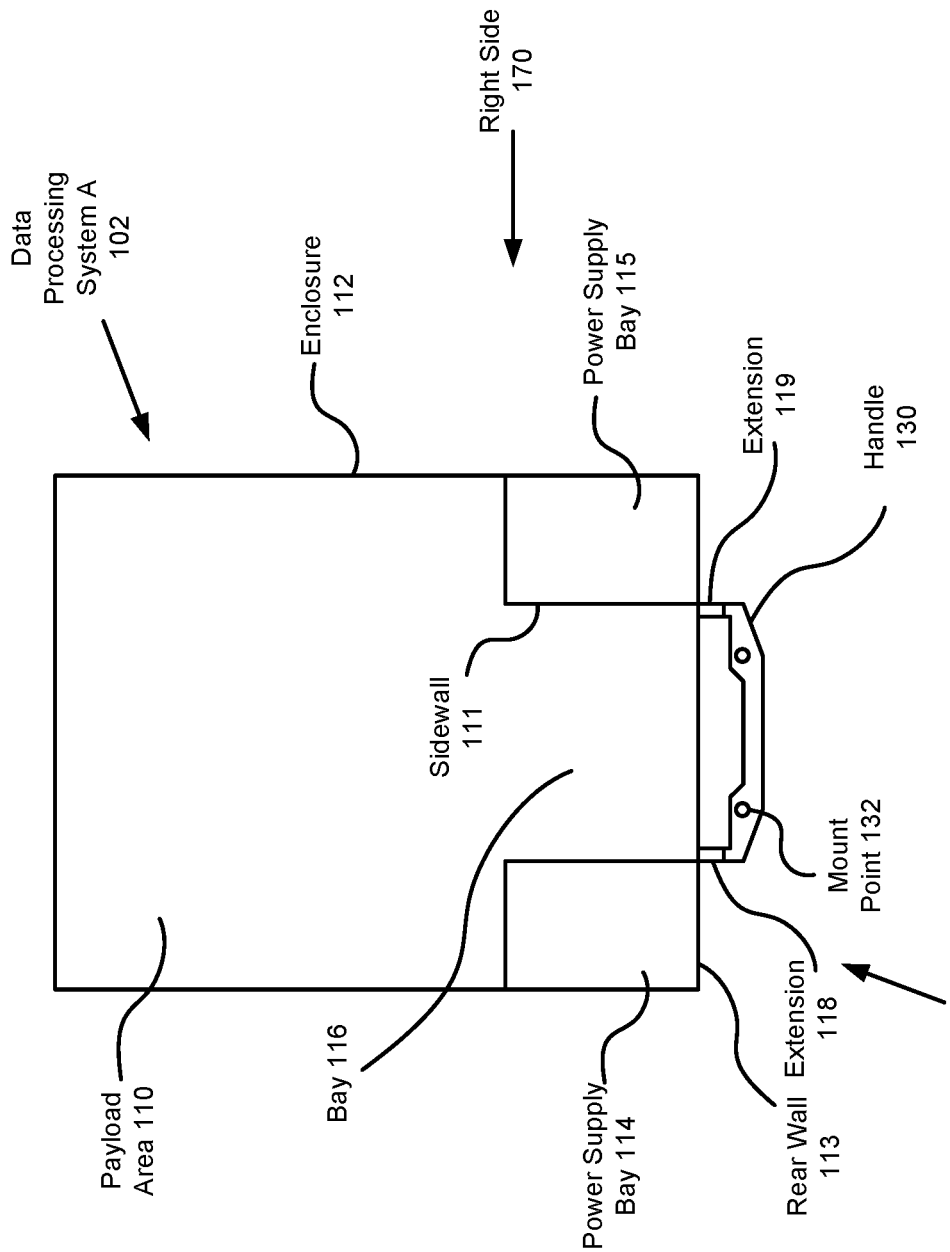
FIG. 1B shows a top view diagram illustrating a data processing system in accordance with an embodiment.
Figure 1C:
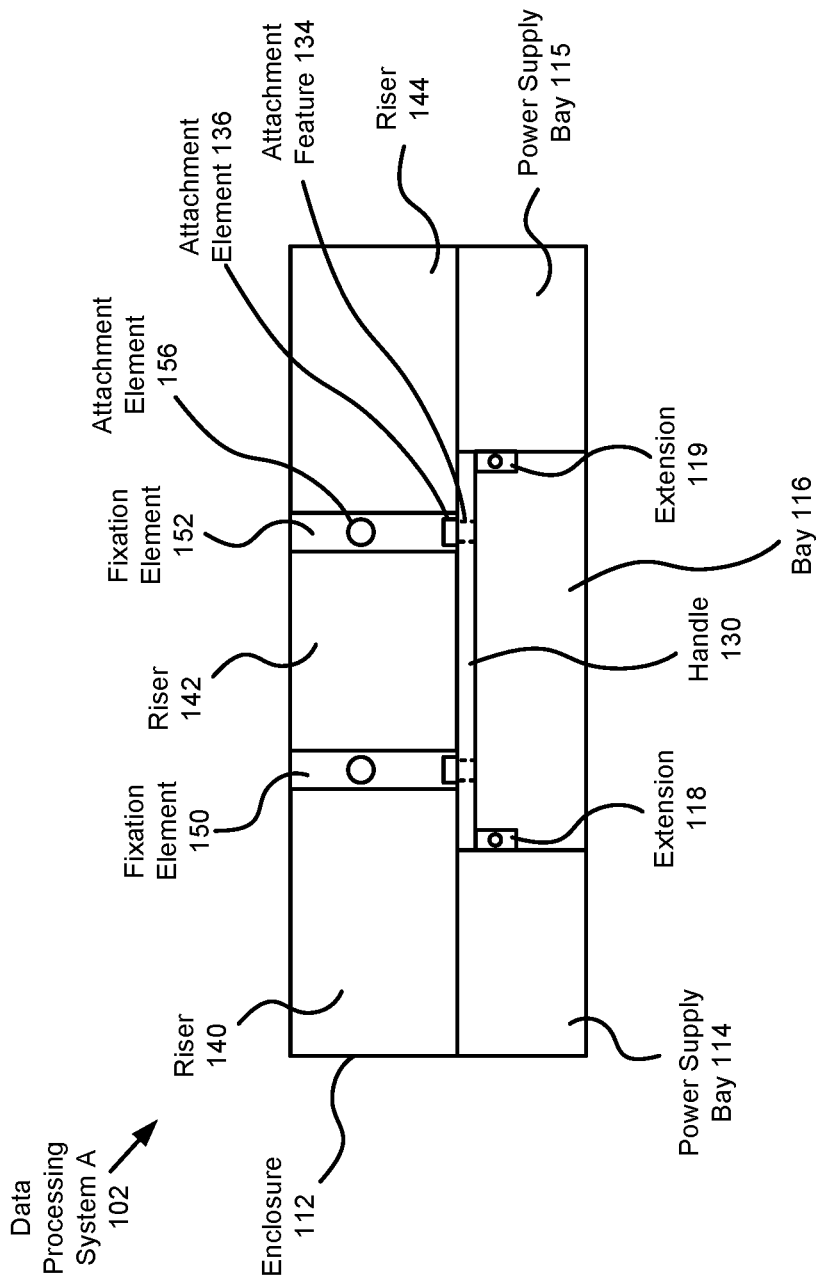
FIG. 1C shows a rear view diagram illustrating a data processing system in accordance with an embodiment.
Figure 1D:
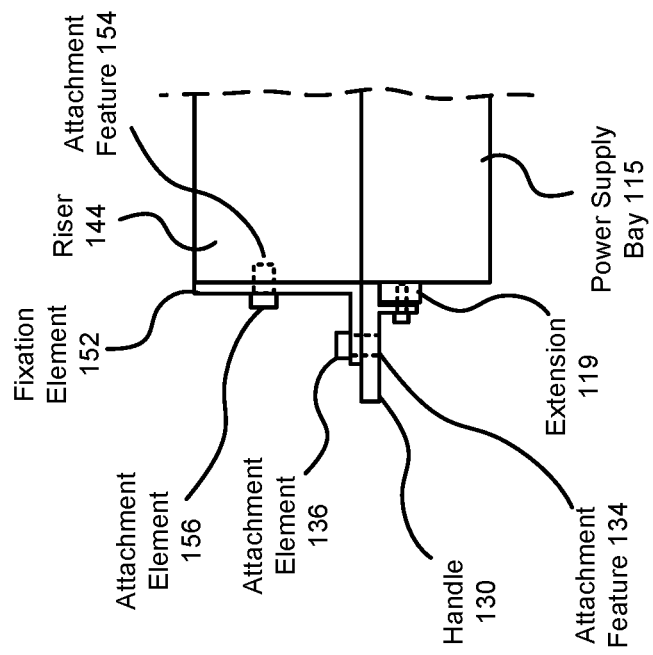
FIG. 1D shows a side view diagram illustrating a data processing system in accordance with an embodiment.

To reduce (or prevent) interference with the functionalities of hardware components that may utilize portions of the front or rear of the enclosure to provide the functionalities, the handle may be connected to internal sidewalls of bays of the enclosure. Force applied to the handle may be transmitted to the enclosure via the sidewalls. Similarly, the handle may be aligned with the edges (e.g., tops, sides, etc.) of the bays thereby occupying less relevant space (e.g., for forming interconnections, for gas flows, etc.) proximate to the bays. Refer to FIGS. 1B-1D for additional details regarding force transmission from the handle to the enclosure.

To secure various hardware components (e.g., risers) positioned in the enclosure, the handle may include functionality to secure risers or other types of hardware components proximate to one end of the enclosure. For example, the handle may include attachment features to which fixation elements may be attached. The fixation elements may secure, in part, hardware components proximate to the end of the enclosure (e.g., which may not be able to be secured using other structures due to reservation of a majority of the area of the end of the enclosure for hardware component functionalities). The fixation elements may transit forces from the risers or other hardware components to the enclosure via the fixation elements, handle, and sidewalls of the bays.

By doing so, embodiments disclosed herein may provide a data processing system that is easier to move and position in a space while still allowing a majority of an end of the enclosure to be used for functionalities of hardware components (e.g., rather than for facilitating repositioning of enclosures of the data processing systems). Consequently, the disclosed data processing system may have improved performance levels with respect to computer implemented services through dedication of larger areas of the end of the data processing system for hardware component functionality (e.g., when compared to data processing systems that dedicate smaller areas for hardware component functionality).

Any of data processing systems 100 may be implemented using a computing device such as a host or server, a personal computer (e.g., desktops, laptops, and tablets), a "thin" client, a personal digital assistant (PDA), a Web enabled appliance, a mobile phone (e.g., Smartphone), and/or any other type of computing device or system. For additional details regarding computing devices, refer to FIG. 2.

The system of FIG. 1A may include any number and types of data processing systems 100. Any of the aforementioned devices may operate independently and/or cooperatively to provide computer implemented services. Data processing systems 100 may provide such services to, for example, user of the data processing systems 100, to other data processing systems 100, and/or to other devices not shown in FIG. 1A.

Data processing systems 100 may be operably connected to any of each other and/or other devices via a communication system (not shown). The communication system may include one or more networks that facilitate communication between data processing systems 100 (or portions thereof) and/or other devices. The networks may include, for example, wired networks, wireless network, public networks, private network, the Internet, etc.

While illustrated in FIG. 1A as including a limited number of specific components, a system in accordance with an embodiment may include fewer, additional, and/or different components than those illustrated therein.

As noted above, data processing systems may include a handle positioned near an end of an enclosure to facilitate positioning of the data processing systems. Turning to FIG. 1B, a top view diagram of data processing system A 102 in accordance with an embodiment is shown. Any of data processing systems 100 may be similar to data processing system A 102.

As seen in FIG. 1B, data processing system A 102 may include payload area 110, enclosure 112, power supply bays (e.g., 114-115), bay 116, extensions 118-119, and handle 130. Each of these components is discussed below.

Enclosure 112 may include a chassis usable to house other components of data processing system A 112. The chassis may be any type of chassis. For example, the chassis may be a rack mount chassis, a sled, and/or other type of structure for housing components of a data processing system.

Generally, enclosure 112 may be implemented with a physical structure including one or more areas in which a payload, fans, various hardware components (e.g., processors, memory modules, etc.) and/or other components may be positioned. For example, enclosure 112 may include payload area 110 in which a payload (e.g., some number of hardware components) may be positioned.

The payload may include any number and types of hardware components. The hardware components may, at least in part, provide the computer implemented services offered by data processing system A 102. The hardware components may be modularized. For example, a host processor module, a secure control module, a communications module, and/or other types of modules that include groups of hardware components that may contribute to functions (e.g., the modules may facilitate performance of various functionalities) of data processing A 102 may be positioned in or near payload area 110.

Enclosure 112 may also be divided into various bays (e.g., 114-116). The bays may be portions of the interior of enclosure 112 that are delineated using some number of walls. For example, any of power supply bays 114-115 may be delineated for other regions using walls (e.g., sheets/plates of metal) such as sidewall 111.

Different types of hardware devices may be positioned in the respective bays. For example, power supplies may be positioned in power supply bays 114-115, communication components (e.g., network interface cards) may be positioned in bay 116, etc. While some of these components (e.g., such as power supplies) may include handles that extend outside of enclosure 112, these handles may not transmit force to enclosure 112 and/or these handles of the power supplies may not be sufficiently strong to apply sufficient force to move enclosure 112 without damaging themselves or causing other undesired impacts. Thus, as will be discussed below, handle 130 may be utilized to move enclosure 112 due to the force management capacity of handle 130.

When providing their functionalities, the hardware components positioned in enclosure 112 may need to interact with an ambient environment around enclosure 112. For example, gas flows may need to be exchanged with the ambient environment to thermally manage the hardware components, the hardware components may need to be connected to other hardware components using cabling or other means to facilitate operable connections to other devices, etc.

To facilitate interaction with the ambient environment, enclosure 112 may include rear side 172 that is substantially entirely dedicated for interaction with the ambient environment. For example, rear side 172 may include minimal support structures or other structures that do not contribute to interactions between hardware components within enclosure 112 and the ambient environment around enclosure 112.

To improve the density of packing of hardware components and/or for other benefits, the sides of enclosure 112 that extend from rear side 172 may be substantially closed. For example, enclosure 112 may include substantially solid sidewalls such as right side 170. Top, bottom, and a left sides of enclosure 112 may also be substantially solid, while a front side opposite of rear side 172 may also facilitate interactions with the ambient environment.

Enclosure 112 may structurally manage the hardware components positioned within it. For example, enclosure 112 may include structural members (e.g., sidewalls) that resist deformation of enclosure 112. Consequently, when forces are applied to enclosure 112, enclosure 112 may move based on the applied forces thereby causing the hardware components positioned therein to be similarly moved within an environment.

To facilitate repositioning of enclosure 112, handle 130 may be mechanically coupled to enclosure 112 via the extensions (e.g., 118-119) and sidewalls (e.g., 112) of one or more bays. The sidewalls may be internal sidewalls (e.g., that are not aligned with the boundaries of enclosure 112) that delineate the power supply bays from other portions of the interior of enclosure 112.

Handle 130 may include one or more structural members that limit deformation of handle 130. Handle 130 may be attached to the extensions (e.g., 118-119) using one or more attachment elements, further discussed below with respect to FIGS. 1C-2D.

Handle 130 may have a shape and may be positioned with respect to the rear of enclosure 112 to facilitate gripping by a person. For example, handle 130 may include a bar which may be grasped by a person (e.g., illustrated in FIG. 1B between the instances of mount point 132). The extensions and other portions of handle 130 may position the bar a sufficient distance away from the rear of enclosure 112 such that a person may move their hand through the space between the rear of enclosure 112 and handle 130 to facilitate grasping of the bar.

Because, as noted above, a majority of the rear of enclosure 112 may be reserved for components, handle 130 may include one or more features that allow portions of hardware proximate to the rear of enclosure 112 to be mechanically attached to handle 130. When so attached, forces applied to the hardware components may be transmitted to enclosure 112 via handle 130, extensions (e.g., 118-119), and sidewalls (e.g., 112). To do so, handle 130 may include one or more of mount point 132. Mount point 132 may include an attachment feature to which attachment elements may be attached thereby allowing other hardware components to be attached to handle 130. Refer to FIGS. 1C-1D for additional details regarding attachment of components to handle 130.

Extensions 118-119 may be implemented with one more structural members (e.g., blocks, bars, rods, etc.). The structural members may be attached to corresponding sidewalls (e.g., 112). The extensions may extend outward from the rear of enclosure 112 a distance sufficient to allow clearance of a person's hand between the rear and handle 130.

Turning to FIG. 1C, a rear view diagram (e.g., looking towards rear side 172) of data processing system A 102 in accordance with an embodiment is shown.

To provide computer implemented services, data processing system A 102 may include any number of risers (e.g., 140-144) positioned above the bays (e.g., 114-116). The risers may include one or more hardware components that contribute to the computer implemented services. The risers may be positioned proximate to the rear of enclosure 112. Consequently, as discussed above, the risers may not have access to mechanical structure of enclosure 112 to stabilize them in place.

To stabilize the risers, one or more fixation elements (e.g., 150-152) may be attached to handle 130 (e.g., via attachment feature 134 and attachment element 136). The fixation elements may be implemented using, for example, right angle brackets, L-brackets, and/or other types of structural elements that may be positioned near the rear of enclosure 112 when attached to handle 130.

Handle 130 may include one or more of attachment feature 134 positioned at mount points. Attachment feature 134 may be implemented using, for example, a threaded hole or other structure to which attachment element 136 may be reversibly attached. Attachment element 136 may be implemented with a bolt or other structure capable of reversibly attaching to attachment feature 134. A portion of fixation element 152 may be positioned between attachment feature 134 and attachment element 136 thereby allowing fixation element 152 to be reversibly secured to handle 130.

To stabilize any of risers 140-144, attachment element 156 may be used to secure fixation element to an attachment feature of a riser. Refer to FIG. 1D for additional details regarding attachment of risers to handle using fixation elements.

To reserve a majority of the area of the rear of enclosure near bay 116 for use for hardware component functionalities, extensions 118-119 may be attached to upper portions of the sidewalls near the top of bay 116 and/or near a plane in which the tops of power supply bays 114-115 is positioned. Consequently, while handle 130 is attached to extensions 118-119, handle 130 may be substantially aligned in the plane (e.g., thereby being aligned with the tops of the bays). Accordingly, handle 130 may not substantially occupy the space extending outward from bay 116. Thus, the space may be used, for example, to route cabling or other structures from outside of enclosure 112 to bay 116.

Risers 140-144 may have similar or different shapes. In an embodiment, the risers are implemented as full slot height risers (e.g., occupying all of the space between the bays and the top of enclosure 112.

Turning to FIG. 1D, a side view diagram (e.g., looking towards right side 170) of data processing system A 102 in accordance with an embodiment is shown.

As seen in FIG. 1D, fixation element 152 may be (i) attached to riser 144 via attachment feature 154 and attachment element 156 and (ii) attached to handle 130 via attachment feature 134 and attachment element 136. Consequently, when force is applied to riser 144, the force may be transmitted to fixation element 152, handle 130, sidewall 111, and finally to enclosure 112 thereby stabilizing the relative position and orientation of riser 144 with respect to enclosure 112.

To do so, fixation element 152 may include two members attached to one another (e.g., two bars). The bars may be at right angle to one another, and may have sizes to position one of the members with the rear of enclosure 112 while the other member is attached to handle 130.

To facilitate force transmission, handle 130 may be attached to extension 119 via multiple surfaces. For example, as seen in FIG. 1D, handle may extend over two surfaces of extension 119 (e.g., an upper surface and a side surface). Mounting hardware (e.g., bolts, screws, etc.) may attach handle 130 to each of these surfaces of extension 119 thereby substantially stabilizing handle 130 in these dimensions.

Additionally, as seen in FIG. 1D, handle 130 may be implemented with a thickness selected to reduce obstructions to bay 116. While this thickness is shown aligned with a plane in which the top of power supply 115 resides, it will be appreciated that the thickness of handle 130 may be shifted upward or downward (e.g., to facilitate better access to risers or bays) without departing from embodiments disclosed herein, and may be of different thicknesses (e.g., to impart additional structural rigidity).

Figure 2:
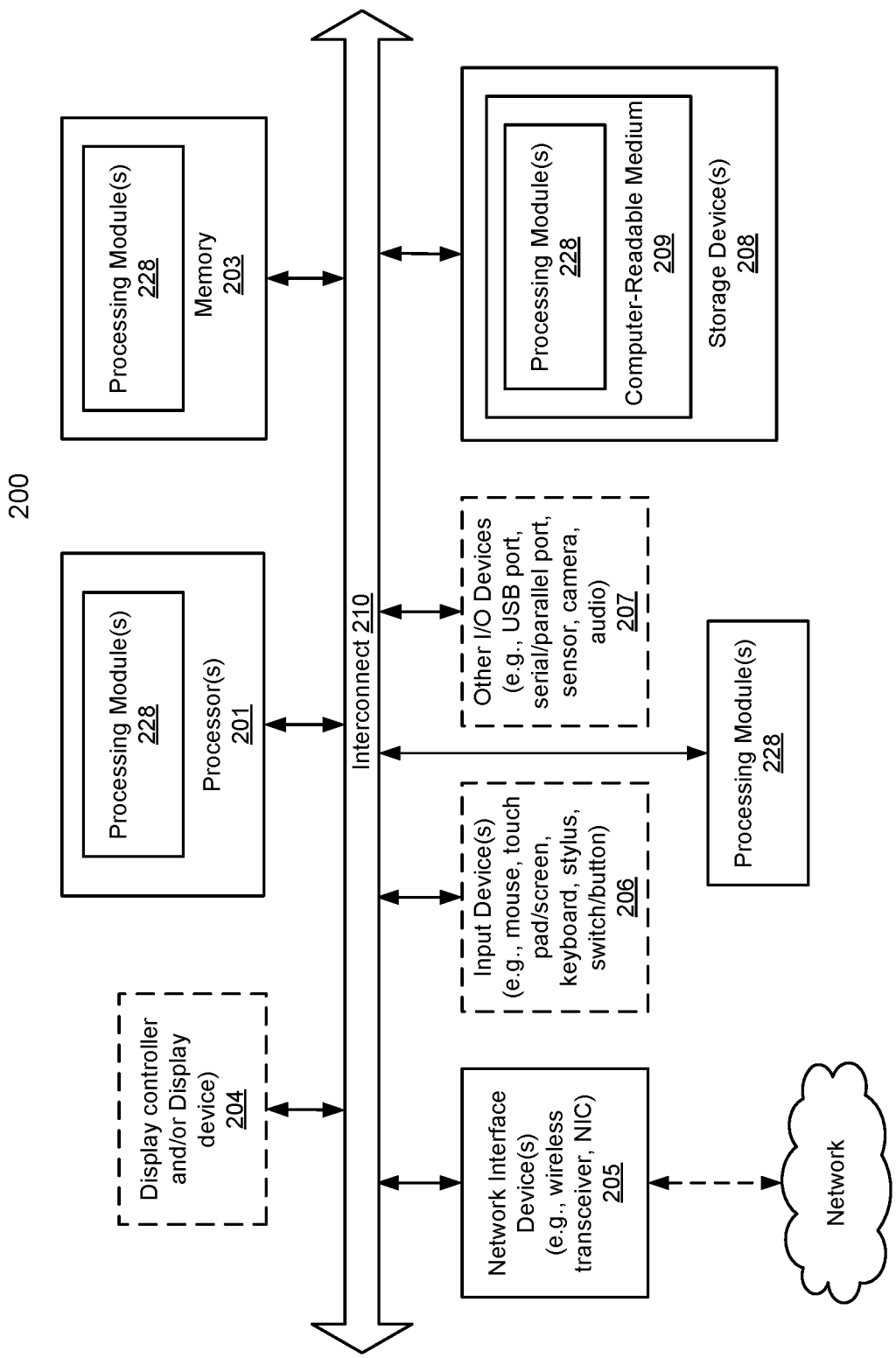
FIG. 2 shows a block diagram illustrating a computing device in accordance with an embodiment.

Turning to FIG. 2, a block diagram illustrating an example of a computing device in accordance with an embodiment is shown. For example, system 200 may represent any of the data processing systems and/or computing devices described above performing any of the processes or methods described above. System 200 can include many different components. These components can be implemented as integrated circuits (ICs), portions thereof, discrete electronic devices, or other modules adapted to a circuit board such as a motherboard or add-in card of the computer system, or as components otherwise incorporated within a chassis (e.g., enclosure 112) of the computer system. Note also that system 200 is intended to show a high-level view of many components of the computer system. However, it is to be understood that additional components may be present in certain implementations and furthermore, different arrangement of the components shown may occur in other implementations. System 200 may represent a desktop, a laptop, a tablet, a server, a mobile phone, a media player, a personal digital assistant (PDA), a personal communicator, a gaming device, a network router or hub, a wireless access point (AP) or repeater, a set-top box, or a combination thereof. Further, while only a single machine or system is illustrated, the term "machine" or "system" shall also be taken to include any collection of machines or systems that individually or jointly execute a set (or multiple sets) of instructions to perform any one or more of the methodologies discussed herein.

In one embodiment, system 200 includes processor 201, memory 203, and devices 205-208 via a bus or an interconnect 210. Processor 201 may represent a single processor or multiple processors with a single processor core or multiple processor cores included therein. Processor 201 may represent one or more general-purpose processors such as a microprocessor, a central processing unit (CPU), or the like. More particularly, processor 201 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 201 may also be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a co-processor, an embedded processor, or any other type of logic capable of processing instructions.

Processor 201, which may be a low power multi-core processor socket such as an ultra-low voltage processor, may act as a main processing unit and central hub for communication with the various components of the system. Such processor can be implemented as a system on chip (SoC). Processor 201 is configured to execute instructions for performing the operations discussed herein. System 200 may further include a graphics interface that communicates with optional graphics subsystem 204, which may include a display controller, a graphics processor, and/or a display device.

Processor 201 may communicate with memory 203, which in one embodiment can be implemented via multiple memory devices to provide for a given amount of system memory. Memory 203 may include one or more volatile storage (or memory) devices such as random access memory (RAM), dynamic RAM (DRAM), synchronous DRAM (SDRAM), static RAM (SRAM), or other types of storage devices. Memory 203 may store information including sequences of instructions that are executed by processor 201, or any other device. For example, executable code and/or data of a variety of operating systems, device drivers, firmware (e.g., input output basic system or BIOS), and/or applications can be loaded in memory 203 and executed by processor 201. An operating system can be any kind of operating systems, such as, for example, Windows® operating system from Microsoft®, Mac OS®/iOS® from Apple, Android® from Google®, Linux, Unix®, or other real-time or embedded operating systems such as VxWorks.

System 200 may further include IO devices such as devices (e.g., 205, 206, 207, 208) including network interface device(s) 205, optional input device(s) 206, and other optional IO device(s) 207. Network interface device(s) 205 may include a wireless transceiver and/or a network interface card (NIC). The wireless transceiver may be a WiFi transceiver, an infrared transceiver, a Bluetooth transceiver, a WiMax transceiver, a wireless cellular telephony transceiver, a satellite transceiver (e.g., a global positioning system (GPS) transceiver), or other radio frequency (RF) transceivers, or a combination thereof. The NIC may be an Ethernet card.

Input device(s) 206 may include a mouse, a touch pad, a touch sensitive screen (which may be integrated with a display device of optional graphics subsystem 204), a pointer device such as a stylus, and/or a keyboard (e.g., physical keyboard or a virtual keyboard displayed as part of a touch sensitive screen). For example, input device(s) 206 may include a touch screen controller coupled to a touch screen. The touch screen and touch screen controller can, for example, detect contact and movement or break thereof using any of a plurality of touch sensitivity technologies, including but not limited to capacitive, resistive, infrared, and surface acoustic wave technologies, as well as other proximity sensor arrays or other elements for determining one or more points of contact with the touch screen.

IO devices 207 may include an audio device. An audio device may include a speaker and/or a microphone to facilitate voice-enabled functions, such as voice recognition, voice replication, digital recording, and/or telephony functions. Other IO devices 207 may further include universal serial bus (USB) port(s), parallel port(s), serial port(s), a printer, a network interface, a bus bridge (e.g., a PCI-PCI bridge), sensor(s) (e.g., a motion sensor such as an accelerometer, gyroscope, a magnetometer, a light sensor, compass, a proximity sensor, etc.), or a combination thereof. IO device(s) 207 may further include an imaging processing subsystem (e.g., a camera), which may include an optical sensor, such as a charged coupled device (CCD) or a complementary metal-oxide semiconductor (CMOS) optical sensor, utilized to facilitate camera functions, such as recording photographs and video clips. Certain sensors may be coupled to interconnect 210 via a sensor hub (not shown), while other devices such as a keyboard or thermal sensor may be controlled by an embedded controller (not shown), dependent upon the specific configuration or design of system 200.

To provide for persistent storage of information such as data, applications, one or more operating systems and so forth, a mass storage (not shown) may also couple to processor 201. In various embodiments, to enable a thinner and lighter system design as well as to improve system responsiveness, this mass storage may be implemented via a solid state device (SSD). However, in other embodiments, the mass storage may primarily be implemented using a hard disk drive (HDD) with a smaller amount of SSD storage to act as a SSD cache to enable non-volatile storage of context state and other such information during power down events so that a fast power up can occur on re-initiation of system activities. Also a flash device may be coupled to processor 201, e.g., via a serial peripheral interface (SPI). This flash device may provide for non-volatile storage of system software, including a basic input/output software (BIOS) as well as other firmware of the system.

Storage device 208 may include computer-readable storage medium 209 (also known as a machine-readable storage medium or a computer-readable medium) on which is stored one or more sets of instructions or software (e.g., processing module, unit, and/or processing module/unit/logic 228) embodying any one or more of the methodologies or functions described herein. Processing module/unit/logic 228 may represent any of the components described above. Processing module/unit/logic 228 may also reside, completely or at least partially, within memory 203 and/or within processor 201 during execution thereof by system 200, memory 203 and processor 201 also constituting machine-accessible storage media. Processing module/unit/logic 228 may further be transmitted or received over a network via network interface device(s) 205.

Computer-readable storage medium 209 may also be used to store some software functionalities described above persistently. While computer-readable storage medium 209 is shown in an exemplary embodiment to be a single medium, the term "computer-readable storage medium" should be taken to include a single medium or multiple media (e.g., a centralized or distributed database, and/or associated caches and servers) that store the one or more sets of instructions. The terms "computer-readable storage medium" shall also be taken to include any medium that is capable of storing or encoding a set of instructions for execution by the machine and that cause the machine to perform any one or more of the methodologies disclosed herein. The term "computer-readable storage medium" shall accordingly be taken to include, but not be limited to, solid-state memories, and optical and magnetic media, or any other non-transitory machine-readable medium.

Processing module/unit/logic 228, components and other features described herein can be implemented as discrete hardware components or integrated in the functionality of hardware components such as ASICS, FPGAs, DSPs or similar devices. In addition, processing module/unit/logic 228 can be implemented as firmware or functional circuitry within hardware devices. Further, processing module/unit/logic 228 can be implemented in any combination hardware devices and software components.

Note that while system 200 is illustrated with various components, it is not intended to represent any particular architecture or manner of interconnecting the components; as such details are not germane to embodiments disclosed herein. It will also be appreciated that network computers, handheld computers, mobile phones, servers, and/or other data processing systems which have fewer components or perhaps more components may also be used with embodiments disclosed herein.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments disclosed herein also relate to an apparatus for performing the operations herein. Such a computer program is stored in a non-transitory computer readable medium. A non-transitory machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g., circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments disclosed herein are not described with reference to any particular programming language. It will be appreciated that a variety of programming languages may be used to implement the teachings of embodiments disclosed herein.

In the foregoing specification, embodiments have been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A data processing system that provides computer implemented services, the data processing system comprising:
   hardware components that provide the computer implemented services;
   an enclosure that houses the hardware components, the enclosure comprising:
      a bay positioned between a first power supply bay and a second power supply bay;
      the first power supply bay comprising a first sidewall delineating the first power supply bay from the bay;
      a second power supply bay comprising a second sidewall delineating the second power supply bay from the bay;
      a first extension connected to the first sidewall and extending outward a first distance from a rear of the enclosure;
      a second extension connected to the second sidewall and extending outward the first distance from the rear of the enclosure;
      a handle attached to the first extension and the second extension; and
      a space above a top of the bay, a top of the first sidewall, and a top of the second sidewall, the space being adapted to receive a hardware component of the hardware components.

2. The data processing system of claim 1, wherein the first sidewall comprises a metal plate that extends inward a second distance from a rear of the enclosure.

3. The data processing system of claim 2, wherein the metal plate extends away from a bottom of the enclosure by a third distances defining a top edge of the metal plate, the top edge of the metal place being the top of the first sidewall.

4. The data processing system of claim 3, wherein the first extension is connected proximate to the top edge of the metal plate at the rear of the enclosure.

5. The data processing system of claim 4, wherein the bay extends away from the bottom of the enclosure by the third distances defining a top of the bay, and a top of the first power supply bay is aligned with a top of the bay.

6. The data processing system of claim 5, wherein the handle comprises a flat member having a thickness, and the thickness lies substantially in a plane aligned with the top of the bay.

7. The data processing system of claim 1, wherein the handle comprises an attachment feature that facilitates attachment of a fixation element to the handle.

8. The data processing system of claim 7, wherein:
   the fixation element is adapted to secure a portion of the hardware component to the handle after the hardware component is installed within the space of the enclosure, the portion of the hardware component being proximate to the rear of the enclosure.

9. The data processing system of claim 8, wherein the fixation element comprises:
   a bracket adapted to, when secured to the handle, position a plate in a plane aligned with the rear of the enclosure.

10. The data processing system of claim 9, wherein the hardware component is a riser, and the plate in the plane aligned with the rear of the enclosure comprises an attachment feature adapted to reversibly attach to the portion of the riser.

11. The data processing system of claim 10, wherein, while the attachment feature is attached to the portion of the riser, the portion of the riser is fixedly held in place, and force applied to the riser is transmitted to the enclosure through the handle, the first extension, and the first sidewall.

12. The data processing system of claim 1, wherein the first extension is directly connected to the first sidewall and the second extension is also directly connected to the second sidewall.

13. An enclosure for a data processing system, comprising:
   a payload area adapted to house hardware components for providing computer implemented services;
   a bay positioned between a first power supply bay and a second power supply bay;
   the first power supply bay comprising a first sidewall delineating the first power supply bay from the bay;
   a second power supply bay comprising a second sidewall delineating the second power supply bay from the bay;
   a first extension connected to the first sidewall and extending outward a first distance from a rear of the enclosure;
   a second extension connected to the second sidewall and extending outward the first distance from the rear of the enclosure;
   a handle attached to the first extension and the second extension; and
   a space above a top of the bay, a top of the first sidewall, and a top of the second sidewall, the space being adapted to receive a hardware component of the hardware components.

14. The enclosure of claim 13, wherein the first sidewall comprises a metal plate that extends inward a second distance from a rear of the enclosure.

15. The enclosure of claim 14, wherein the metal plate extends away from a bottom of the enclosure by a third distances defining a top edge of the metal plate.

16. The enclosure of claim 15, wherein the first extension is connected proximate to the top edge of the metal plate at the rear of the enclosure.

17. The enclosure of claim 16, wherein the bay extends away from the bottom of the enclosure by the third distances defining a top of the bay, and a top of the first power supply bay is aligned with a top of the bay.

18. The data processing system of claim 1, wherein the handle comprises a flat member having a thickness, and the handle comprises an attachment feature that extends through a majority of the thickness.

19. The data processing system of claim 1, wherein the handle comprises a flat member having a thickness and an attachment feature that extends through a majority of the thickness, the attachment feature facilitating reversible attachment of a fixation element to the handle.

20. The data processing system of claim 1, wherein the handle comprises an attachment feature that facilitates reversible attachment of a fixation element to the handle, and the fixation element comprises a bracket adapted to, when secured to the handle, position a plate in a plane aligned with the rear of the enclosure.

* * * * *